(12) United States Patent
Coustans et al.

(10) Patent No.: US 10,581,380 B2
(45) Date of Patent: Mar. 3, 2020

(54) SELF-POLARISED QUARTZ OSCILLATOR CIRCUIT

(71) Applicant: EM Microelectronic-Marin SA, Marin (CH)

(72) Inventors: Mathieu Coustans, Lausanne (CH); Luca Rossi, Lausanne (CH); Yves Godat, Cornaux (CH)

(73) Assignee: EM Microelectronic-Martin SA, Marin (CH)

( * ) Notice: Subject to any disclaimer, the term of this patent is extended or adjusted under 35 U.S.C. 154(b) by 0 days.

(21) Appl. No.: 15/949,193

(22) Filed: Apr. 10, 2018

(65) Prior Publication Data

US 2018/0342982 A1 Nov. 29, 2018

(30) Foreign Application Priority Data

May 24, 2017 (EP) ..................... 17172736

(51) Int. Cl.
*H03L 5/00* (2006.01)
*H03B 5/36* (2006.01)
(52) U.S. Cl.
CPC .................... *H03B 5/364* (2013.01)
(58) Field of Classification Search
CPC ... H03B 5/364; H03B 2201/031; G01R 19/04
USPC .......... 331/73, 109, 116 R, 116 M, 158, 160
See application file for complete search history.

(56) References Cited

U.S. PATENT DOCUMENTS

| | | | |
|---|---|---|---|
| 4,028,638 A | 6/1977 | Towle | |
| 5,180,967 A * | 1/1993 | Yamazaki | G05F 3/262 323/312 |
| 7,868,688 B2 * | 1/2011 | Easwaran | H03F 3/345 327/552 |
| 2005/0174183 A1 * | 8/2005 | Tachibana | H03B 5/364 331/158 |
| 2007/0188256 A1 | 8/2007 | Maheshwari | |
| 2008/0042770 A1 | 2/2008 | Berens | |

FOREIGN PATENT DOCUMENTS

FR 2 305 056 A1 10/1976

OTHER PUBLICATIONS

European Search Report dated Oct. 31, 2017 in European Application 17172736.5, filed May 24, 2017 (with English Translation of Categories of cited documents).

* cited by examiner

*Primary Examiner* — Richard Tan
(74) *Attorney, Agent, or Firm* — Oblon, McClelland, Maier & Neustadt, L.L.P.

(57) ABSTRACT

The self-polarised quartz oscillator circuit comprises an amplifier with an output which is connected to a first electrode of the quartz and an input which is connected to a second electrode of the quartz, an output capacitor which is connected to the first electrode of the quartz and an input capacitor which is connected to the second electrode of the quartz. The amplifier is polarised by a current through a MOS polarisation transistor, which is generated in an amplitude regulation assembly which comprises also an amplitude regulation stage. The second electrode of the quartz is connected to the gate of the polarisation transistor and to the amplitude regulation stage in order to modulate the polarisation current and to regulate the oscillation amplitude of the quartz.

12 Claims, 4 Drawing Sheets

SELF-POLARISED QUARTZ OSCILLATOR CIRCUIT

This application claims priority from European Patent Application No. 17172736.5 filed on May 24, 2017, the entire disclosure of which is hereby incorporated herein by reference.

TECHNICAL FIELD

The invention relates to a quartz oscillator circuit of the self-polarised type, in particular for use in watchmaking.

PRIOR ART

In general, a quartz oscillator circuit comprises an inverter composed of two complementary MOS transistors which are mounted in series with a current source between two terminals of a supply voltage source in order to define an active branch. A source of one of the MOS transistors is connected to the current source, whilst a source of the other transistor is connected to one of the terminals of the supply voltage source. The drains of the NMOS and PMOS transistors are connected at output to a first electrode of the quartz, whilst the gates of said transistors at input are connected to a second electrode of the quartz. Traditionally, a first phase-shift capacitor is connected to the first electrode of the quartz, whilst a second adjustable capacitor is connected to the second electrode of the quartz.

Such an oscillator circuit is in particular described in the state of the art by the patent CH 623 450, in which there is likewise provided a polarisation resistor disposed between the gates and the drains of the transistors of the inverter. Because of this assembly, a voltage oscillation at the level of the quartz is established in order to produce an oscillation signal with a frequency determined by the first output electrode of the quartz.

The polarisation resistor must be of a high value in order to reduce the current in the active branch of the oscillator. This high-value polarisation resistor must in particular be chosen in order not to destroy the necessary negative resistance which is generated by the inverter and the current which passes through it in order to maintain oscillation at the level of the quartz. Production of such a high-value resistor in the integrated circuit is a problem because a large space is occupied in the integrated circuit, which is a disadvantage of such an oscillator circuit.

The amplitude of the oscillation at the level of the quartz can likewise be maintained by an adaptable current source which is controlled by a regulation unit. One embodiment of such a regulation unit is described for example in the article entitled "Quartz oscillators for watches" by Eric A. Vittoz, published in the proceedings of the tenth International Congress of Chronometry, Geneva, September 1979, vol. 3, pages 131 to 140.

In the article entitled "High-performance crystal oscillator circuits: Theory and application" by Eric A. Vittoz, published in the IEEE journal of solid-state circuits, centre of the IEEE service, Piscataway, N.J., US, vol. 23 no. 3 of 1 Jun. 1988, it is provided to dispose, between the drain and the gate of a MOS transistor M1 of an active branch of the oscillator circuit, a pseudo-resistor as means of active polarisation. As represented in FIG. 11 of this article, this pseudo-resistor is produced by a MOS transistor M17, the drain and the source of which are connected respectively to the drain and to the gate of the MOS transistor M1. The gate of this pseudo-resistor transistor is polarised by means of two diode-connected MOS transistors M19 and M15 in series with a current source M10 between the two supply terminals of the supply voltage source.

One disadvantage of this assembly shown in FIG. 11 of this article is that the polarisation current provided by the current source M10 is lost through the two diode-connected transistors. This polarisation current is used only in order to determine the determined potentials of the diode-connected transistors, and does not contribute at all to operation in the active branch of the oscillator.

In the patent CH 689 088, an oscillator circuit is described in which the active polarisation means is an operational transconductance amplifier mounted as voltage follower between the drain and gate terminals of a MOS transistor of an active branch of the oscillator circuit. Two capacitors C1, C2 are each connected respectively to one terminal of the quartz K and to earth, whilst a compensation capacitor $C_K$ connects the output of the amplifier and one of the terminals of the quartz. The capacitors C1, C2 have a high capacitive value in order to stabilise the amplifier, which constitutes a disadvantage, because they do not make it possible to produce a small-size oscillator circuit. Furthermore, a reduction in components for the polarisation of the transistors and regulation of the generated oscillation are not produced.

In the patent application EP 2 073 377 A1, a quartz oscillator circuit with active polarisation is described. The oscillator circuit comprises an inverter formed by two complementary PMOS and NMOS transistors which are mounted in series with a first current source between two terminals of a supply voltage source in order to define an active branch. The source of the PMOS transistor is connected to the first current source, whilst the source of the NMOS transistor is connected to one of the terminals of the supply voltage source. The drains of the transistors are connected to a first electrode of the quartz in order to provide for example an output signal. The gates of the transistors are connected to a second electrode of the quartz. A first phase-shift capacitor is connected to the first electrode of the quartz, whilst a second capacitor is connected to the second electrode of the quartz.

The circuit also comprises, between the drains and gates of the transistors, a pseudo-resistor produced by a NMOS transistor in order to serve as active polarisation. The source of this pseudo-resistor transistor is connected to the gates of the complementary transistors, whilst the drain of this pseudo-resistor transistor is connected to the drains of the complementary transistors. The gate of the pseudo-resistor transistor is polarised by a second polarisation current source. This oscillator circuit therefore requires an external polarisation, this means that there must be external current sources for operation of this oscillator circuit, which constitutes a disadvantage.

There may likewise be cited the U.S. Pat. No. 7,598,821 B2, which describes a quartz oscillator circuit, controlled in amplitude with a large voltage and temperature range. The oscillator circuit comprises two capacitors connected at each terminal of a quartz, first and second complementary active transistors forming an inverter amplifier, first and second polarisation means of the active transistors, a first current source formed by a transistor of the same type as the second active transistor, and control means of the current for the second polarisation means. In stable operational conditions, the second polarisation means provides a polarisation voltage via the gate of the second active transistor corresponding to the transistor gate voltage of the first current source within a voltage deviation. One disadvantage of this oscillator circuit is that the amplitude regulation and the polarisation of the inverter amplifier are not combined in order to introduce a modulation easily into the oscillation amplitude regulation and to reduce the electrical consumption.

SUMMARY OF THE INVENTION

The object of the invention is therefore to remedy the disadvantages of the state of the art by providing a quartz oscillator circuit of the self-polarised type, which is easy to integrate and combines amplitude regulation and polarisation of the inverter stage connected to the quartz.

To this end, the invention relates to a quartz oscillator circuit of the self-polarised type, comprising, in an active branch of the oscillator circuit, an amplifier with an output which is connected to a first electrode of the quartz and an input which is connected to a second electrode of the quartz, an output capacitor being connected to the first electrode of the quartz and an input capacitor being connected to the second electrode of the quartz, the amplifier being polarised by a current which is generated in an amplitude regulation assembly, the amplitude regulation assembly comprising an amplitude regulation stage having a current source and a polarisation transistor of current which is controlled by a gate of the transistor via the amplitude regulation stage and connected to the amplifier, in order to polarise it, the second electrode of the quartz, which is connected to the amplifier input, being connected to the gate of the polarisation transistor and to the amplitude regulation stage so as to vary the polarisation current through the polarisation transistor and to regulate the oscillation amplitude of the quartz, wherein the amplitude regulation stage comprises a first current mirror of a MOS type which comprises a diode-connected transistor of a second type of conductivity, one source of which is connected to a first terminal of a supply voltage source, a gate of the diode-connected transistor is connected to the gate of the PMOS polarisation transistor of a second type of conductivity and to the second electrode of the quartz, wherein the gate of the diode-connected transistor is connected to one side of a filter resistor whilst another side of the filter resistor is connected to a gate of another transistor of a second type of conductivity of the first current mirror and to a first electrode of a filter capacitor, a second electrode of which is connected to the first terminal of the supply voltage source, wherein a source of the other transistor of a second type of conductivity is connected to the first terminal of the supply voltage source via a base resistor in order to determine a regulation current of a current source.

Particular embodiments of the quartz oscillator circuit are defined in the dependent claims 2 to 12.

One advantage of the oscillator circuit according to the invention is that it comprises a single electronic unit or assembly for amplitude regulation, which rearranges the functions current source, rectifier or detector of peaks and polarisation of the amplifier of the active branch of the oscillator circuit. This makes it possible to reduce the number of components for operation of the oscillator circuit and likewise to reduce the electrical consumption in order to design this oscillator circuit with ultra-low power. This quartz oscillator circuit can thus be used in order to provide a clock signal of a time base in the field of watchmaking.

One advantage of the oscillator circuit is having an amplitude regulation with a polarisation of the active branch of the oscillator circuit, which comprises a modulation of the polarisation current. Control of variation and amplitude regulation is obtained by an amplitude regulation stage which controls a polarisation transistor via its base or its gate by being connected to an input electrode of the quartz and to an input of the amplifier of the active branch.

One advantage of the oscillator circuit resides in the fact that the amplifier of the active branch of the oscillator can comprise, by being polarised by the polarisation transistor, at least one MOS transistor or an arrangement of an inverter composed of a PMOS transistor mounted in series with a NMOS transistor between two supply voltage terminals. The quartz is connected, on the one hand, at the output to the drains of the NMOS and/or PMOS transistors and, on the other hand, at the input to the gates of the NMOS and/or PMOS, directly or by means of filter capacitors. The input terminal of the quartz is likewise connected to the gate of the polarisation transistor and to a gate of a MOS transistor of a first current mirror of the stage of the amplitude regulation.

BRIEF DESCRIPTION OF THE FIGURES

The aims, advantages and features of the quartz oscillator circuit of the self-polarised type will appear better in the following description on the basis of embodiments which are non-limiting and illustrated by the drawings in which.

DETAILED DESCRIPTION

In the following description, all the elements of the quartz oscillator circuit which are well known to the person skilled in the art in this technical field will be referred to only in a simplified manner. In principle, reference is made to a self-polarised quartz oscillator circuit which is able to provide clock signals, in particular for use in watchmaking.

Figure 1:
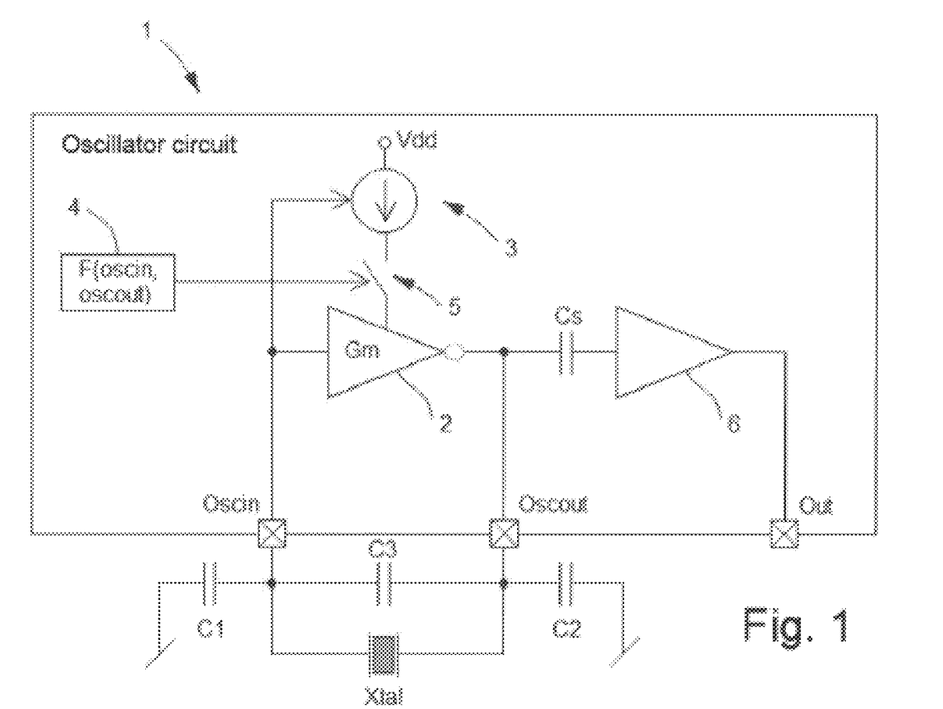
FIG. 1 represents a simplified block diagram of the quartz oscillator circuit of the self-polarised type according to the invention.

In FIG. 1, a simplified block diagram of the quartz oscillator circuit of the self-polarised type 1 is represented, in order to understand its operating principle. The aim is to introduce a modulation into the amplitude regulation part of the oscillating signal in order to reduce the electrical consumption and likewise to allow self-polarisation of the quartz oscillator. The modulation acts in principle on the polarisation current of the active branch of the oscillator. Thus, the polarisation current comprises a continuous current component and an alternating current component.

The quartz oscillator circuit 1 can be of the Pierce type. It comprises a quartz Xtal or a quartz resonator, a first capacitor C1, which is connected between the first electrode of the quartz Xtal connected to a connection terminal Oscin of the oscillator integrated circuit, and earth, and a second capacitor C2 which is connected between the second electrode of the quartz Xtal connected to a connection terminal Oscout of the oscillator integrated circuit, and earth. A third capacitor C3, termed parasitic, can be mounted in parallel to the quartz Xtal or quartz resonator. This third capacitor C3 can also be an integral part of the quartz crystal. Normally, without being represented in FIG. 1, each capacitor C1, C2 and C3 comprises an external capacitor connected to the connection terminals Oscin and Oscout and adjustable integrated capacitors, and also parasitic capacitors in the oscillator integrated circuit. Capacitors external to the oscillator integrated circuit have the references Cin and Cout in the following Figures, described hereafter. The capacitive values of these capacitors can be of the order of 1 pF or less.

The oscillator integrated circuit 1 also comprises an amplifier 2, which can be, for example, a transconductance inverter amplifier 2 Gm. This amplifier is connected to the quartz Xtal by the connection terminals Oscin and Oscout. An input of the amplifier 2 is connected to the input terminal Oscin whilst an output of the amplifier 2 is connected to the output terminal Oscout. The amplitude regulation of the oscillation at the terminals of the quartz Xtal is obtained by an assembly comprising a modulator 5 represented by a commutator in FIG. 1 which is controlled by a functional block 4 dependent upon the oscillation at the terminals of the quartz Xtal, and a current source 3 controlled by an oscillation signal at the input terminal Oscin. The current source 3 is connected to the supply voltage terminal Vdd and provides polarisation to the amplifier 2 by means of the modulator 5. The quartz oscillator circuit is therefore self-polarised by the functional assembly for amplitude regulation.

The quartz oscillator circuit 1 can also comprise at the output of the amplifier 2, a stage for voltage level shift. This stage of voltage level shift is composed of an input capacitor Cs followed by an oscillation amplifier 6 in order to provide at output via another output terminal Out, an oscillation signal, in particular for the timing of a time base.

The functioning of this quartz oscillator circuit 1 will be understood better with reference to two embodiments presented in the following FIGS. 2 and 3.

Figure 2:
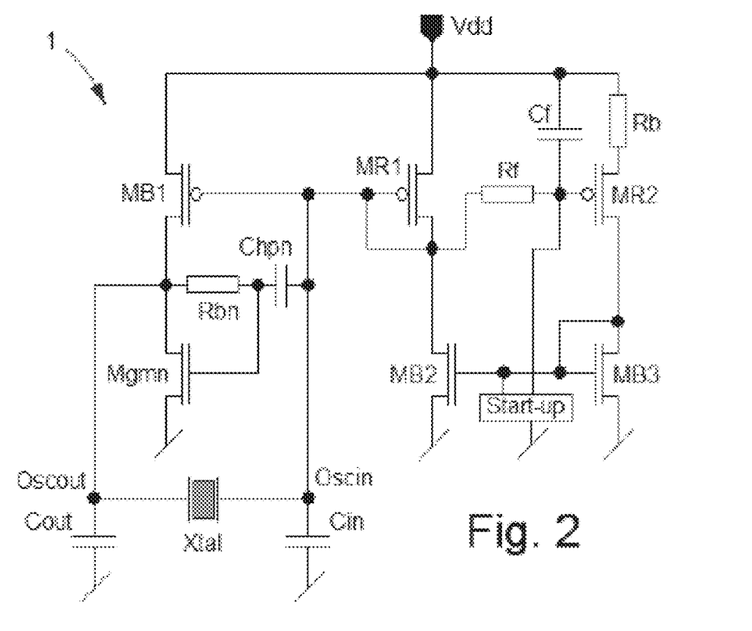
FIG. 2 represents a first embodiment of the quartz oscillator circuit of the self-polarised type according to the invention.

In FIG. 2, a first embodiment of the self-polarised quartz oscillator circuit 1 is represented. The oscillator circuit 1 is intended to be connected between a first terminal and a second terminal of a supply voltage source. The first terminal can be the supply voltage terminal Vdd and the second terminal can be the earth terminal, or inversely.

This oscillator circuit 1 comprises an amplifier composed mainly of a first transistor Mgmn, which is a transistor of a first type of conductivity, such as a MOS transistor. Preferably the first transistor Mgmn is a NMOS transistor. This first transistor Mgmn has its source connected to the second terminal of the supply voltage source, which is the earth terminal in this embodiment. The drain of the first transistor Mgmn is connected to a first electrode of the quartz Xtal at the output terminal Oscout. A first resistor Rbn can be connected between the drain and the gate of the first transistor Mgmn and a first capacitor Chpn can be connected between the gate and a second electrode of the quartz Xtal to the input terminal Oscin. An output capacitor Cout is connected between the first electrode of the quartz Xtal and the second terminal of the supply voltage source, which is the earth terminal, and an input capacitor Cin is connected between the second electrode of the quartz Xtal and the second terminal of the supply voltage source, which is the earth terminal. In general, input Cin and output Cout capacitors, and also the quartz Xtal are components which are external to the oscillator integrated circuit.

The polarisation of the amplifier, i.e. of the first transistor Mgmn is provided by a polarisation transistor MB1, which is a transistor of a second type of conductivity, and preferably, in this first embodiment, a PMOS transistor. The source of this polarisation transistor MB1 is connected to the first terminal of the supply voltage source, which is the supply voltage terminal Vdd in this case, whilst the drain is connected to the drain of the first transistor Mgmn and to the first electrode of the quartz Xtal. The gate of the polarisation transistor MB1 is connected to an amplitude regulation stage at the current source. The gate of the polarisation transistor MB1 is also connected to the second electrode of the quartz Xtal and to a terminal of the first capacitor Chpn forming a connection node for control of modulation of the current in the polarisation transistor MB1, as explained hereafter.

It should be noted that it can also be a possibility to connect directly the gate of the first transistor Mgmn to the second electrode of the quartz Xtal at the input terminal Oscin, and also to the gate of the polarisation transistor MB1. The resistor Rbn and the capacitor Chpn serve, before any filtering, to attenuate any parasitic noise or jitter in order to obtain an oscillating signal with regulated amplitude at the terminals of the quartz Xtal.

The stage of amplitude regulation comprises firstly a first current mirror which is a current mirror of the MOS type. This first current mirror comprises a transistor of a second type of conductivity, which is a diode-connected PMOS transistor MR1, the source of which is connected to the first terminal of the supply voltage source, which is the supply voltage terminal Vdd. The gate of the diode-connected transistor MR1 is connected to the gate of the polarisation transistor MB1 and to the connection node of the first capacitor Chpn and of the second electrode of the quartz Xtal. The gate of the diode-connected transistor MR1 is connected to one side of a filter resistor Rf. The other side of this filter resistor Rf is connected to the gate of a transistor of a second type of conductivity, which is a PMOS transistor MR2 of the first current mirror and to a first electrode of a filter capacitor Cf, a second electrode of which is connected to the first terminal of the supply voltage source, which is the supply voltage terminal Vdd. The source of the PMOS transistor MR2 is connected to the supply voltage terminal Vdd via a base resistor Rb, which makes it possible to determine the current for regulation of the amplitude regulation stage. The diode-connected transistor MR1 and the rectifier composed of the filter resistor Rf and of the filter capacitor Cf form a peak detector.

By way of information, the dimensioning of the filter elements Rf and Cf is effected such that the pass-band of the filter is far less than the tenth of the resonance frequency of the quartz which, in this case, is at 3.2 kHz for a frequency of the resonator at approx. 32.768 kHz. A range can be for example at a frequency of 560 Hz, which is achievable with the help of a resistor Rf of 120 MOhms and a capacitor Cf of 4.7 pF.

The amplitude regulation stage also comprises a second current mirror, which is a current mirror of a first type of conductivity, such as of the NMOS type. This second current mirror comprises a diode-connected NMOS transistor MB3, the source of which is connected to the second terminal of the supply voltage source, which is the earth terminal. The drain of this diode-connected transistor MB3 is connected to the drain of the PMOS transistor MR2 of the first current mirror. The gate of the diode-connected transistor MB3, which is connected to the drain, is connected to the gate of the NMOS transistor MB2 of the second current mirror. The source of this NMOS transistor MB2 is connected to the second terminal of the supply voltage source, which is the earth terminal. The drain of this NMOS transistor MB2 is connected to the diode-connected transistor MR1 of the first current mirror and to the connection node for modulation control of the current in the polarisation transistor MB1. The reference current generated in the PMOS transistor MR2 is thus mirrored in the second current mirror in order to supply the diode-connected PMOS transistor MR1 in order to regulate the oscillation amplitude by means of the polarisation transistor MB1. Hence, the functional assembly for amplitude regulation rearranges the functions of a current source, of rectifier or peak detector and of polarisation of the amplifier of the active branch of the oscillator circuit.

As represented in FIG. 2, there can also be provided a start-up block, designated start-up, for starting up the amplitude regulation stage. This start-up block is connected to the gate of the PMOS transistor MR2 of the first current mirror and to the gate of the NMOS transistors MB2 and MB3 of the second current mirror. This start-up block will not be described but is already known in particular from the book of E. Vittoz and J. Fellrath, entitled "CMOS analog integrated circuits based on weak inversion operations" of IEEE J. Solid-State Circuits, vol. 12, no. 3, pages 224 to 231 of June 1977.

By way of example, there can be used a simple native conductor transistor for a zero gate-source voltage. The gate is connected to the earth of the circuit, the source is connected to the gate of transistors MB2 and MB3, and the drain is connected to the gate of the transistor MR2 by thus causing the circuit to converge. When the circuit converges towards an operating point, the gate-source voltage is negative and thus blocks the native transistor.

It should also be noted that the self-polarised quartz oscillator circuit 1 can also be provided inversely to the assembly presented in FIG. 2. In these conditions, the transistors of the NMOS type Mgmn, MB2, MB3 become transistors of the PMOS type connected to the supply voltage terminal Vdd and the transistors of the PMOS type MB1, MR1 and MR2 become transistors of the NMOS type connected to earth. The quartz Xtal and the capacitors Cin and Cout are therefore connected to the supply voltage terminal Vdd.

For adequate operation of the amplitude regulation stage described above, this requires to make the PMOS transistors MR1 and MR2 operate with low inversion. Thus, the voltage developed at the source of the PMOS transistor MR2, and the voltage difference of the resistor Rb assuming that the PMOS transistors MR1 and MR2 with the same substrate voltage will be as defined in the following equation:

$$V_{sMR2} = u_t \cdot \ln\left[((W_{MR2}/L_{MR2})/(W_{MR1}/L_{MR1})) \cdot ((W_{MB3}/L_{MB3})/(W_{MB2}/L_{MB2}))\right]$$

where W defines the width of the channel of the MOS transistor, and L defines the length of the channel of the MOS transistor, and the component $u_t$ is the thermodynamic voltage.

The voltage at the terminals of the base resistor Rb will in principle be constant, which is not entirely the case for the voltage on the gate of the PMOS transistor MR1 as a function of the oscillation at the terminals of the quartz Xtal. Thus there is formed a reference current through the base resistor Rb and the PMOS transistor MR2 which is defined according to the following equation:

$$Iref = u_t \cdot \ln\left[((W_{MR2}/L_{MR2})/(W_{MR1}/L_{MR1})) \cdot ((W_{MB3}/L_{MB3})/(W_{MB2}/L_{MB2}))\right]/Rb$$

This current Iref is then transmitted through the current mirrors to the PMOS polarisation transistor MB1 according to a defined ratio. In the active branch of the amplifier via the first transistor Mgmn, the polarisation current is a current modulated over a constant current component. When the oscillation begins at the terminals of the quartz Xtal, the amplitude limit is sensibly chosen in order to avoid the PMOS transistors MR1 and MR2 leaving the desired weak inversion region. A simple criterion is that:

$$V_{dd} - (V_{osc} + V_{gMR2}) \leq V_{Tp}$$

In theory, if the configuration of the PMOS transistor is preserved, it can be calculated that the gate voltage of the PMOS transistor MR2, i.e. $V_{gMR2}$ is:

$$V_{gMR2} = V_{dd} - u_t \cdot \ln\left[((W_{MR2}/L_{MR2})/(W_{MR1}/L_{MR1}) \cdot ((W_{MB3}/L_{MB3})/(W_{MB2}/L_{MB2}))\right] - \left[V_{T0} + n \cdot u_t \cdot \ln(I_F)\right]$$

where $I_F$ is the inversion current.

The amplitude regulation is also well presented in the book of E. Vittoz and J. Fellrath, entitled "CMOS analog integrated circuits based on weak inversion operations" of IEEE J. Solid-State Circuits, vol. 12, no. 3, pages 224 to 231 of June 1977, which is incorporated here as reference. This gives the advantage to the non-linear behaviour of the transistor:

$$(I_D/I_{spec}) = e^{(vg - vt + |voscin| \cdot \sin(\omega t))/ut}$$

The continuous component of the drain current is obtained by averaging this equation over a period:

$$(I_D/I_{spec}) = e^{(vg - vt)/ut} \cdot (1/2\pi) \int e^{((voscin/n \cdot ut) \cdot \sin(\omega t))} d\omega t \text{ integral from } -\pi \text{ to } +\pi$$

This leads analytically to a tabulated function which is termed the modified Bessel function of order 0 {Io(x)}:

$$(I_D/I_{spec}) = e^{(vg - vt)/ut} \cdot (1 + v_1^2/2^2 + v_1^4/(2^2 \cdot 4^2) + v_1^6/(2^2 \cdot 4^2 \cdot 6^2) + \ldots)$$

Thus, a current is proposed which is dependent upon the Bessel function of the amplitude. As such, and by way of non-limiting example, the peak amplitude is, per se, defined by a ratio of specific currents, and according to pairing restrictions, the latter shown by the geometry. For a peak amplitude of 60 mV, there is a function Io(x)=2.1 by tabulation, x being itself defined by $$\left[((W_{MR2}/L_{MR2})/(W_{MR1}/L_{MR1})) \cdot ((W_{MB3}/L_{MB3})/(W_{MB2}/L_{MB2}))\right].$$

A choice can therefore be made such that $W_{MR2}/L_{MR2} = 21 \cdot W_{MR1}/L_{MR1}$ and $W_{MB3}/L_{MB3} = 10 \cdot W_{MB2}/L_{MB2}$.

Figure 3:
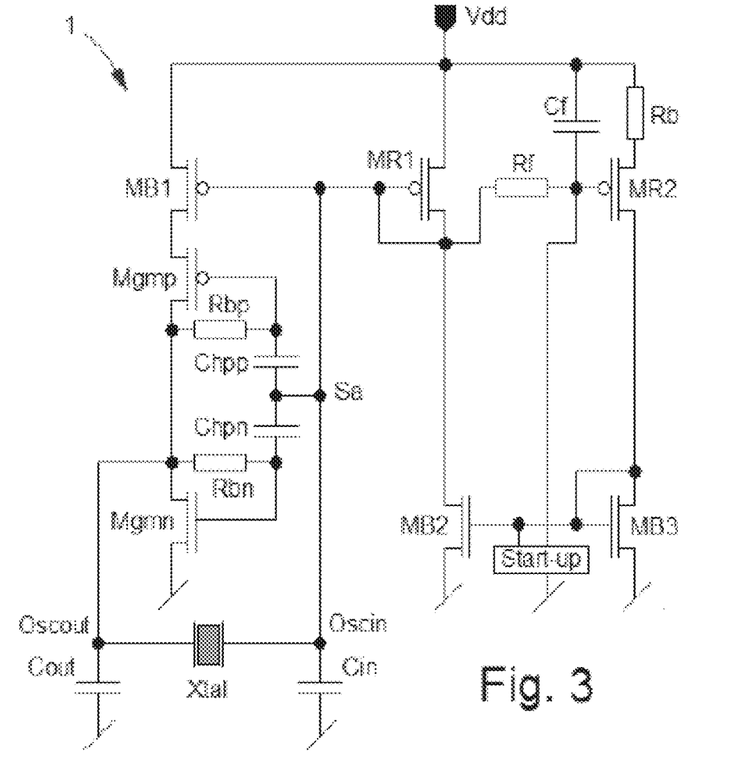
FIG. 3 represents a second embodiment of the quartz oscillator circuit of the self-polarised type according to the invention.

In FIG. 3, a second embodiment of the self-polarised quartz oscillator circuit 1 is represented. It should be noted that the components of this FIG. 3 which correspond to those of FIG. 2 bear the same reference symbols. As the major part of the components of the second embodiment are similar to those described with reference to FIG. 2, only the differences of these oscillator circuits are explained hereafter.

The essential difference of this second embodiment resides in the fact that the amplifier in the active branch of the oscillator circuit is a transconductance inverter amplifier Gm. This amplifier therefore comprises an inverter composed of a first transistor Mgmn of a first type of conductivity connected in series with a second transistor Mgmp of a second type of conductivity. The first transistor Mgmn is preferably a NMOS transistor, and the second transistor Mgmp is preferably a PMOS transistor.

The first transistor Mgmn has its source connected to the earth terminal in this second embodiment. The drain of the first transistor Mgmn is connected to the drain of the second transistor Mgmp and to a first electrode of the quartz Xtal at the output terminal Oscout. A first resistor Rbn can be connected between the drain and the gate of the first transistor Mgmn and a first capacitor Chpn can be connected between the gate of the first transistor and a second electrode of the quartz Xtal at the input terminal Oscin. A second resistor Rbp can be connected between the drain and the gate of the second transistor Mgmp and a second capacitor Chpp can be connected between the gate of the second transistor and the second electrode of the quartz Xtal at the input terminal Oscin. An output capacitor Cout is connected between the first electrode of the quartz Xtal and the earth terminal, and an input capacitor Cin is connected between the second electrode of the quartz Xtal and the earth terminal. Generally input Cin and output Cout capacitors, and also the quartz Xtal, are components external to the oscillator integrated circuit. Adjustment and parasitic capacitors, not represented, are also in the oscillator integrated circuit 1.

The polarisation of the amplifier is obtained by means of the polarisation transistor MB1 of a second type of conductivity, the source of which is connected to the supply voltage terminal Vdd, whilst the drain is connected to the source of the second PMOS transistor Mgmp. As mentioned above, the gate of the polarisation transistor MB1 is connected to an amplitude regulation stage at the current source. The gate of the polarisation transistor MB1 is also connected to the second electrode of the quartz Xtal and to a terminal of the first capacitor Chpn and to a terminal of the second capacitor Chpp forming a connection node Sa for modulation control of the current in the polarisation transistor MB1.

It should be noted that it is also conceivable to connect directly the gate of the first transistor Mgmn and the gate of the second transistor Mgmp to the second electrode of the quartz Xtal at the input terminal Oscin, and also to the gate of the polarisation transistor MB1. The resistors Rbn and Rbp and the capacitors Chpn and Chpp can be removed. The resistors Rbn and Rbp and the capacitors Chpn and Chpp serve above all for filtering in order to attenuate any parasitic noise or any jitter in order to obtain a regulated amplitude oscillating signal at the terminals of the quartz Xtal.

It should also be noted that all the components of the amplitude regulation stage at the current source are the same as those described with reference to FIG. 2. They have therefore already been described. Furthermore, as indicated previously, it is conceivable to invert the arrangement of the components in this second embodiment of FIG. 3 of the self-polarised quartz oscillator circuit 1. In these conditions, the transistors of the NMOS type Mgmn, MB2, MB3 become transistors of the PMOS type connected to the supply voltage terminal Vdd and the transistors of the PMOS type Mgmp MB1, MR1 and MR2 become transistors of the NMOS type connected to earth. The capacitors Cin and Cout connected to the quartz Xtal, are therefore connected to the supply voltage terminal Vdd.

Figure 4A:
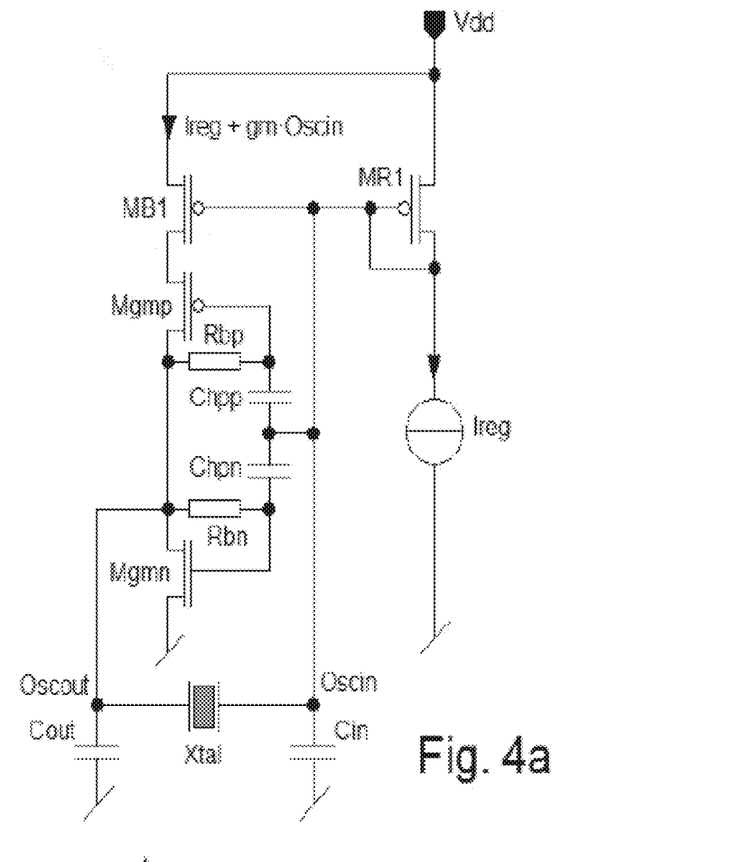
FIGS. 4*a* and 4*b* represent a part of the oscillator circuit of the second embodiment and the signals at the terminals of the quartz and the current of the self-polarisation transistor according to the invention.
Figure 4B:
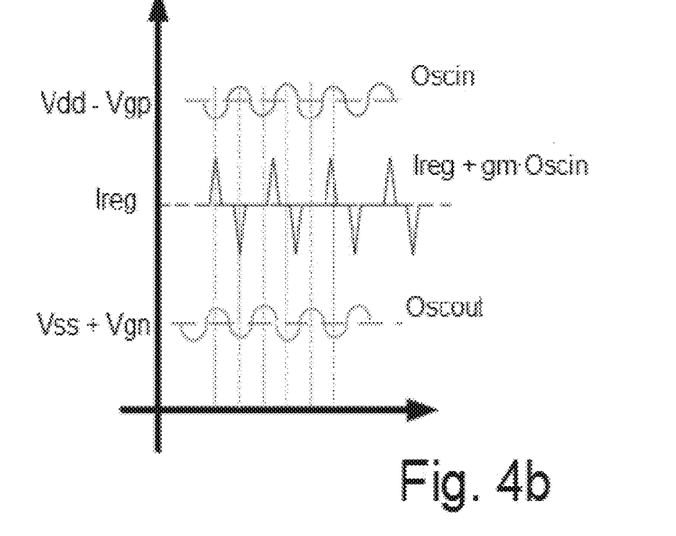

In order to understand the current modulation in the active branch of the oscillator by means of the polarisation transistor MB1, reference can be made to FIGS. 4a and 4b. The circuit represented in FIG. 4a repeats a part of the oscillator circuit of FIG. 3. The amplitude regulation stage is simplified by the diode-connected PMOS transistor MR1 of the first current mirror and by a current source Ireg connected to the drain of the transistor MR1. The polarisation current Ireg+gm·Oscin via the polarisation transistor MB1 is therefore modulated over time according to the oscillation frequency at the level of the quartz at the terminals Oscin and Oscout. There is a gate voltage modulation of the polarisation transistor MB1 due to the amplitude regulation modulation.

As represented in this embodiment of FIG. 4a there is a phase opposition between the signals Oscin and Oscout which is ensured by the inverter assembly with the transistors Mgmp and Mgmn. FIG. 4b represents the variation of the polarisation current Ireg+gm·Oscin, and the voltages Oscin and Oscout in phase opposition at the input and output terminals. The voltage Vgp is the gate voltage of the transistor Mgmp, whilst the voltage Vgn is the gate voltage of the transistor Mgmn.

It is noted that with such an amplitude regulation functional assembly which rearranges the functions of current source, of rectifier and of polarisation of the active branch of the oscillator circuit, a reduction in components is obtained and, for this reason, a reduction in electrical consumption of the oscillator circuit.

As described briefly with reference to FIG. 1, there can also be provided, in the self-polarised quartz oscillator circuit, an amplifier stage for voltage level shift. This output stage can provide an oscillating signal on the basis of the oscillation signal at the input terminal Oscin. The output stage for voltage level shift can comprise an inverter assembly connected to the terminals of the supply voltage. This inverter assembly can be identical to the inverter amplifier of the active branch of the oscillator. This inverter assembly comprises therefore a PMOS transistor connected in series with a NMOS transistor, and the connection of the RC filters, one electrode of the capacitors of which is connected to the input terminal Oscin. The drains of the PMOS and NMOS transistors provide the output oscillating signal.

By way of indication, the average polarisation current is less than 30 nA, for example of the order of 5 nA or less, and the supply voltage can be less than 3 V, for example of the order of 0.6 V. The oscillation frequency at the terminals of the quartz Xtal is 32.768 kHz with a momentary error contained in the envelope of the quality factor.

For the question of minimum voltages, Kirchoff Law can be written as follows:

$$Vdd - Vg_{MR1,2} - Vdsat_{MB2,MB3} - Vs_{MR2} = 0$$

where Vg is the gate voltage, Vd is the drain voltage and Vs is the source voltage, and that leads to the following inequation:

$$Vdd \geq Vg_{MR1,2} + Vdsat_{MB2,MB3} + Vs_{MR2}$$

The voltage at the source of the transistor MR2 can also be replaced according to the following inequation:

$$Vdd \geq Vg_{MR1,2} + Vdsat_{MB2,MB3} + u_t \cdot \ln((S_{MR2}/S_{MR3}) \cdot (S_{MB2}/S_{MB3}))$$

$S_{MR2}$ corresponds to $W_{MR2}/L_{MR2}$, $S_{MR3}$ corresponds to $W_{MR3}/L_{MR3}$, $S_{MB2}$ corresponds to $W_{MB2}/L_{MB2}$ and $S_{MB3}$ corresponds to $W_{MB3}/L_{MB3}$.

In a CMOS technology at 0.18 μm (ALP18), there are certain flexibilities on the threshold voltages as indicated below:

| Threshold voltage | NMOS | PMOS |
| --- | --- | --- |
| 1.8 V standard device | 533 mV | 523 mV |
| 1.8 V low Vt device | 366 mV | 296 mV |
| 3.3 V standard device | 607 mV | 638 mV |

The gate voltage $Vg_{MR1,2}$ is approximately a threshold voltage Vt as indicated in the following equation:

$$Vg_{MR1,2} = Vt + n \cdot u_t \cdot \ln(I_c)$$

One hypothesis is as follows:

$u_t \cdot \ln((S_{T3}/S_{T1}) \cdot (S_{T2}/S_{T4}))$ with the ratio 21 where $3 \cdot u_t = 78$ mV at 25° C.

$Vdsat = u_t \cdot (2 \cdot I_F^{1/2} + 4)$ where $4 \cdot u_t$ to $7 \cdot u_t$ is reasonable.

| Mirror current inversion | Vdd≥ | | NMOS | PMOS |
|---|---|---|---|---|
| Moderated ($I_F \approx 1$) | Vdd ≥ $Vt_{MR1,2}$ + 7 · $u_t$ | | 492 mV | 452 mV |
| Strong ($I_F \approx 10$) | Vdd ≥ $Vt_{T2,4}$ + 10 · $u_t$ | | 626 mV | 556 mV |

As the inversion coefficient is 10 for currents of 5 nA, it is necessary to produce a transistor of 1 μm over 1 mm for the NMOS transistor (LVT) and of 1 μm over 200 μm for the PMOS transistor (LVT). Some measurements can show that an oscillator core at 0.3 V can be produced.

The self-polarised quartz oscillator circuit described above can advantageously be produced in an integrated form with the exception of the quartz Xtal and the capacitors Cin and Cout in a normally doped silicon substrate P in a CMOS technology at 0.18 μm (ALP18). This makes it possible to obtain a self-polarised oscillator circuit and with regulation of the oscillation amplitude.

By way of non-limiting example for calculation of the standard quartz-integrated capacitors, which are specified by their load capacitor $C_L$, the capacitors are in a range of values as indicated in the table below. For values of integrated capacitors, there can be a range of 8 pF to 20 pF, which is reasonable for integration.

| | | | |
|---|---|---|---|
| $C_L$ | Load capacitor | 7 pF | 12.5 pF |
| $C_{IN}$ | Input capacitor | 14 pF | 25 pF |
| $C_{OUT}$ | Output capacitor | 14 pF | 25 pF |
| $C_{PAD}$ | Capacitor of PAD contact range | 2.7 pF | 2.7 pF |
| $C_{OSC\_INPUT}$ | Input capacitor of the amplifier | 3 pF | 3 pF |
| $C_{IN\_ONO} = C_{IN} - C_{PAD} - C_{OSC\_INPUT}$ | Input ONO capacitor | 8.3 pF | 19.3 pF |
| $C_{OUT\_ONO} = C_{OUT} - C_{PAD}$ | Output ONO capacitor | 11.3 pF | 15.4 pF |

Figure 5A:
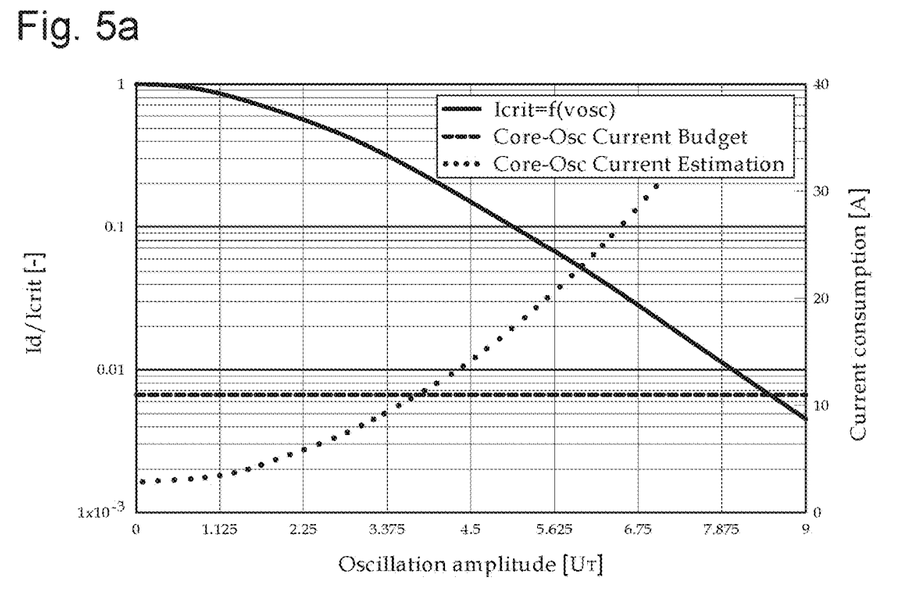
FIGS. 5*a* and 5*b* represent one of the hand the necessary current to an inverter for maintaining an oscillation amplitude of the oscillator circuit, and on the other hand the evolution of the output current of an inverter of the oscillator circuit.
Figure 5B:
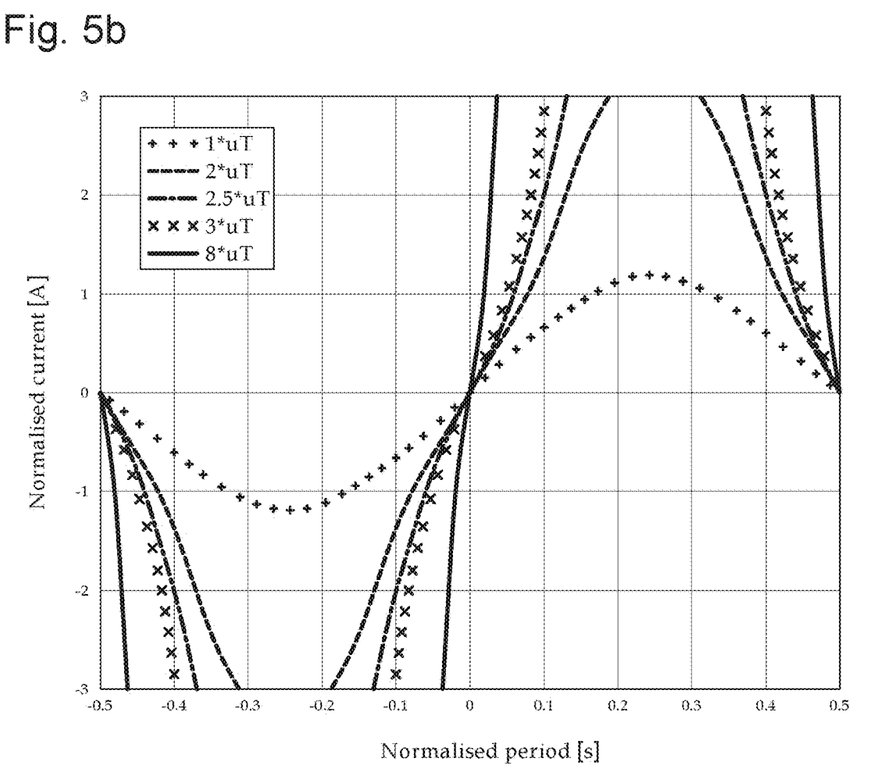

To understand the problematic of the transconductance gm in weak inversion of transistors MR1 and MR2 of the first current source of the amplitude regulation stage, it is referred to FIGS. 5a and 5b. On FIG. 5a, the curve in full line represents the current necessary for an inverter to maintain a defined oscillation amplitude and thus to define a negative impedance adapted to the resonator.

$$I_{qcrit} = g_{mcrit} \cdot n \cdot u_t / 2$$

So the more the amplitude is important, the less the current of polarisation of the transconductance is raised. The transconductance can benefit from it from geometrical effect in weak as in strong inversion to be maximized due to the proportionality of the specific current.

The curve represented by points on the FIG. 5a represents the dynamic consumption of the base capacitor of the quartz, such as capacitors Cin-Cost under condition that the capacitive value is approximately 3 pF. The value of consumption is represented on the vertical axis to the right. If we wish for example to reduce the dynamic consumption of this assembly for example at 10 nA, the curve in interrupted lines refers on the axis to the right. Then it appears clearly the necessity to lower the amplitude of the oscillation in a reasonable manner in 2,3 times the thermodynamic voltage approximately at 60 mV. The amplitude of several products available on the market is superior to 8 times the thermodynamic voltage approximately at 208 mV. These oscillators cannot by this way consume less than 35 nA.

On FIG. 5b, 8 times the thermodynamic voltage allow largely to have a saturation regime and then to introduce a non-linearity allowing the propagation of the current under the form of Dirac. Thus FIG. 5b shows the evolution of the output current of an inverter. The form of wave is a hyperbolic sine. The current is normalized at the current $I_{qcrit}$. The amplitude regulation loop allows to prevent from supplying an upper current after having been stabilized. Therefore, it can define an angle of conduction between T=0 and T=Tangle.

Therefore, when one of the curves of FIG. 5b crosses 1 or −1, the current thus stops to be supplied. So the average value increases with a longer conduction time (angle). A "standard" amplitude of 8 times the thermodynamic voltage allows to obtain a kind of Dirac, but 2.5 times the thermodynamic voltage leads approximatively in 2.5 times more time. This leads to a higher average current. To restore these conditions, the connection of Oscin and the gate of the polarisation transistor of the regulation loop allows to force a condition of current in Dirac.

From the description which has just been given, several variants of the quartz oscillator circuit of the self-polarised type can be designed by the person skilled in the art without leaving the scope of the invention defined by the claims. The transistors can also be bipolar transistors, but the consumption in the case in point is worse than with an arrangement of transistors of the MOS type.

What is claimed is:

1. A quartz oscillator circuit of a self-polarised type, comprising: in an active branch of the quartz oscillator circuit, an amplifier with an output which is connected to a first electrode of a quartz and an input which is connected to a second electrode of the quartz, an output capacitor being connected to the first electrode of the quartz and an input capacitor being connected to the second electrode of the quartz, the amplifier being polarised by a current which is generated in an amplitude regulation assembly, the amplitude regulation assembly including an amplitude regulation stage having a current source and a polarisation transistor, which is controlled by a gate of the polarisation transistor via the amplitude regulation stage, and connected to the amplifier, in order to polarise the amplifier, the second electrode of the quartz, which is connected to the amplifier input, being connected to the gate of the polarisation transistor and to the amplitude regulation stage to vary a polarisation current through the polarisation transistor and to regulate an oscillation amplitude of the quartz, wherein the amplitude regulation stage includes a first current mirror of a MOS type which includes a diode-connected transistor of a second type of conductivity, a source of the diode-connected transistor is connected to a first terminal of a supply voltage source, a gate of the diode-connected transistor is connected to the gate of the polarisation transistor, the polarisation transistor being of the second type of conductivity, and directly to the second electrode of the quartz, wherein the gate of the diode-connected transistor is connected to a first side of a filter resistor whilst a second side of the filter resistor is connected to a gate of a second transistor of the second type of conductivity of the first current mirror and to a first electrode of a filter capacitor, a second electrode of the filter capacitor is connected to the first terminal of the supply voltage source, wherein a source of the second transistor of the second type of conductivity is connected to the first terminal of the supply voltage source via a base resistor in order to determine a regulation current of a current source.

2. The quartz oscillator circuit according to claim 1, wherein the amplifier and the polarisation transistor are disposed in series between two terminals of the supply voltage source.

3. The quartz oscillator circuit according to claim 1, wherein the amplifier comprises a first transistor of the MOS type of the first type of conductivity, a gate of the first transistor is connected on an input side of the amplifier and a first drain is connected on an output side of the amplifier.

4. The quartz oscillator circuit according to claim 3, wherein a second drain of the polarisation transistor is connected to the first drain of the first transistor, a source of the first transistor being connected to the first terminal of the supply voltage source, whilst a source of the polarisation transistor is connected to a second terminal of the supply voltage source.

5. The quartz oscillator circuit according to claim 4, wherein the polarisation transistor is a PMOS transistor, the source of the polarisation transistor is connected to the first terminal of the supply voltage source, and wherein the first transistor is a NMOS transistor, the source of the first transistor is connected to an earth terminal.

6. The quartz oscillator circuit according to claim 5, wherein a first resistor is connected between the drain and the gate of the first transistor, and wherein a first capacitor is connected between the gate and the second electrode of the quartz, and to the gate of the polarisation transistor.

7. The quartz oscillator circuit according to claim 3, wherein the amplifier further comprises a second transistor of the MOS type of the second type of conductivity, a gate of the second transistor is connected on the input side of the amplifier and a drain of the second transistor is connected on the output side of the amplifier, the first and second transistors being connected in series with the polarisation transistor between the first terminal and a second terminal of the supply voltage source.

8. The quartz oscillator circuit according to claim 7, wherein the first transistor is a NMOS transistor, the source of first transistor is connected to an earth terminal, wherein the second transistor is a PMOS transistor, the source of the second transistor is connected to the drain of the polarisation transistor, and the drain of the second transistor is connected to the drain of the first transistor, and wherein the source of the polarisation transistor is connected to the first terminal of the supply voltage source.

9. The quartz oscillator circuit according to claim 8, wherein a first resistor is connected between the drain and the gate of the first transistor, wherein a first capacitor is connected between the gate of the first transistor and the second electrode of the quartz, and to the gate of the polarisation transistor, wherein a second resistor is connected between the drain and the gate of the second transistor, and wherein a second capacitor is connected between the gate of the second transistor and the second electrode of the quartz, and to the gate of the polarisation transistor.

10. The quartz oscillator circuit according to claim 1, wherein the first current mirror is of a PMOS type which comprises a diode-connected PMOS transistor, a source of the diode-connected PMOS transistor is connected to the first supply voltage terminal, a gate of the diode-connected PMOS transistor is connected to the gate of the polarisation transistor and to the second electrode of the quartz, wherein the gate of the diode-connected PMOS transistor is connected to the first side of the filter resistor whilst the second side of the filter resistor is connected to the gate of a second PMOS transistor of the first current mirror and to the first electrode of the filter capacitor, the second electrode of the filter capacitor is connected to the first terminal of the supply voltage source, wherein the source of the second PMOS transistor is connected to the first terminal of the supply voltage source via the base resistor in order to determine a regulation current of the current source.

11. The quartz oscillator circuit according to claim 10, wherein the amplitude regulation stage further comprises a second current mirror, which includes a first diode-connected NMOS transistor, a source of the first diode-connected NMOS transistor is connected to the second terminal of the supply voltage source, which is an earth terminal, wherein a drain of the first diode-connected NMOS transistor is connected to a drain of the second PMOS transistor of the first current mirror, wherein a gate of the first diode-connected NMOS transistor is connected to a drain and to a gate of a second NMOS transistor of the second current mirror, wherein a source of the second NMOS transistor is connected to the earth terminal, wherein a drain of the second NMOS transistor is connected to the diode-connected PMOS transistor of the first current mirror, to the second electrode of the quartz and to the gate of the polarisation transistor for modulation control of the current in the polarisation transistor.

12. The quartz oscillator circuit according to claim 10, wherein the amplitude regulation stage is arranged to operate the diode-connected PMOS transistor and the second PMOS transistor of the first current mirror in weak inversion.

* * * * *